United States Patent [19]

Lofgren

[11] Patent Number: 4,797,575

[45] Date of Patent: Jan. 10, 1989

[54] FLIP-FLOP WITH IDENTICAL PROPAGATION DELAY IN CLOCK PASS THROUGH MODE AND IN NORMAL OPERATION

[75] Inventor: Karl M. J. Lofgren, Long Beach, Calif.

[73] Assignee: Western Digital Corporation, Irvine, Calif.

[21] Appl. No.: 938,626

[22] Filed: Dec. 5, 1986

[51] Int. Cl.[4] ........................ H03K 3/037; H03K 5/13
[52] U.S. Cl. .................................. 307/272.1; 307/443;
307/465; 307/479; 307/480; 307/591; 307/602
[58] Field of Search ................ 307/443, 465, 452–453,
307/468–469, 479, 511, 480–481, 529, 243,
572–573, 575–577, 579, 584, 585, 269, 271, 272
A, 279, 597, 591–595, 602–603, 605, 608;
328/30, 55, 61, 136, 161; 375/120

[56] References Cited

U.S. PATENT DOCUMENTS

| | | | |
|---|---|---|---|
| 3,930,169 | 12/1975 | Kuhn, Jr. ...................... | 307/481 X |
| 4,002,926 | 1/1977 | Moyer ........................... | 307/481 X |
| 4,019,144 | 4/1977 | Lincoln et al. ................ | 307/465 |
| 4,477,738 | 10/1984 | Kouba ........................... | 307/480 X |
| 4,506,165 | 3/1985 | Gulati et al. .................. | 307/443 X |
| 4,506,167 | 3/1985 | Little et al. ................... | 307/272 A X |
| 4,629,909 | 12/1986 | Cameron ....................... | 307/443 X |

OTHER PUBLICATIONS

Puri et al, "Flush-Through Latch", *IBM T.D.B.*, vol. 24, No. 7A, Dec. 1981, pp. 3115–3116.

*Primary Examiner*—Stanley D. Miller
*Assistant Examiner*—D. R. Hudspeth
*Attorney, Agent, or Firm*—Spensley Horn Jubas & Lubitz

[57] ABSTRACT

A flip-flop circuit is provided for use in a phase-locked loop circuit, the flip-flop having two signal paths for selecting a VCO output during velocity lock and phase lock. The two signal paths comprise identical environments and therefore eliminate the phase step exhibited by prior art designs in shifting between velocity lock and phase lock. The circuit is also useful in any application where a clock to output delay of a flip-flop connected for normal operation, must have its propagation delay matched to a circuit which simply delays a signal by the same amount.

4 Claims, 1 Drawing Sheet

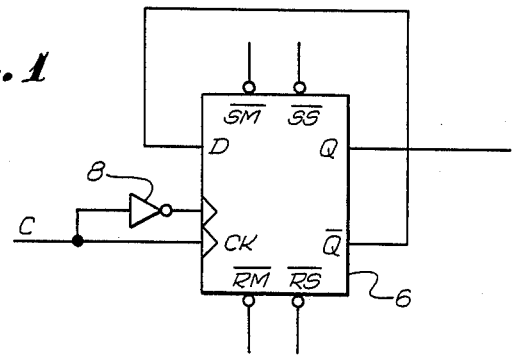
Fig. 1
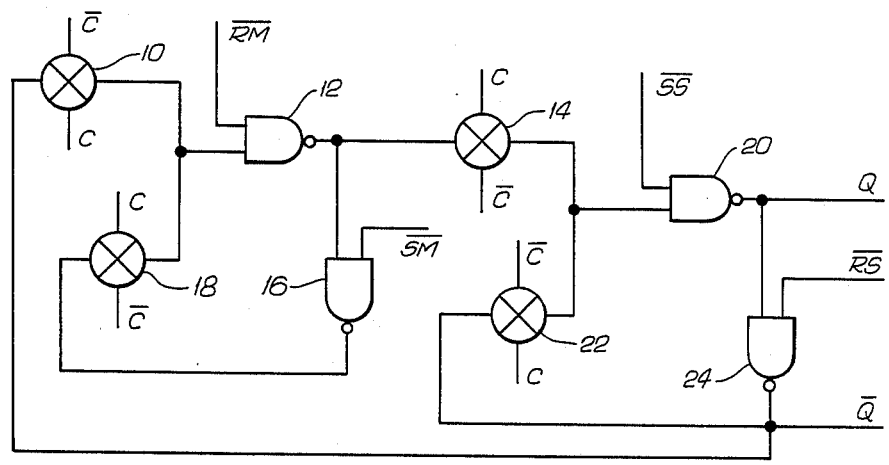
Fig. 2
Fig. 3
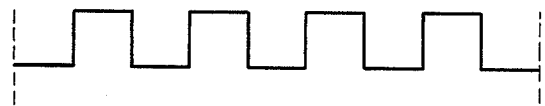
(a) C
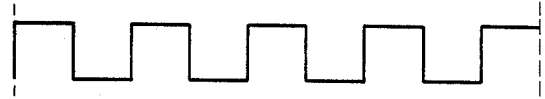
(b) C̄
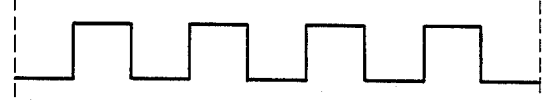
(c) ÷1 Q
(d) ÷2 LOW on Q
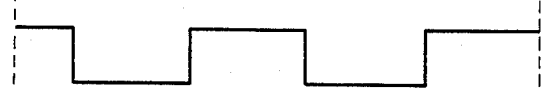
(e) ÷2 HIGH on Q

FLIP-FLOP WITH IDENTICAL PROPAGATION DELAY IN CLOCK PASS THROUGH MODE AND IN NORMAL OPERATION

BACKGROUND OF THE INVENTION

1. Field of the Invention

The present invention relates to data control devices for the transfer of digital data and, more particularly, to techniques for phase locked loop data recovery.

2. Description of the Prior Art

With phase-locked loop (PLL) data recovery, a data signal with noise is processed in a PLL circuit so as to eliminate the noise. The processing involves two states, velocity lock and phase lock. During velocity lock, the PLL acquires the data signal, which in a noise-free form is a fixed frequency signal. In order to accomplish velocity lock, the PLL must be supplied with an additional signal consisting of a particular frequency. This fixed signal is typically supplied by a voltage controlled oscillator (VCO). The particular frequency required depends on the application of the PLL. During phase lock, the PLL will decode the data signal which, free of noise, consists of a series of pulses at varying frequencies. The pulse frequencies are integer multiples of a given base frequency. For example, the base frequency may have a period of 100 nanoseconds, while the data pulses have periods of 200, 300, and 400 nanoseconds. The number of different pulse frequencies in the data signal also depends on the application.

The VC0 output frequency used during velocity lock is typically selected to be the base frequency of the data. The actual frequency used by the PLL circuit will typically be selected to be the fastest frequency of the data signals. In the example given above, the frequency actually used by the PLL circuit during velocity lock would be that having a period of 200 nanoseconds. The frequency selected can be generated by using a divide-by-N circuit applied with the VCO signal. For example, continuing the values in the example above, the VCO signal of 100 nanoseconds would be processed through a divide-by-2 circuit to give a signal having a period of 200 nanoseconds.

During phase lock, the VCO signal required by the PLL to decode the data is the base frequency signal. The typical method of supplying the PLL with both the VCO signal for phase lock and the divided-down VCO signal for velocity lock is to select the desired signal with a multiplexer. One circuit path through the multiplexer passes the VCO signal through a divide-by-N circuit to obtain the signal needed for velocity lock. The other circuit path through the multiplexer selects the VCO signal.

Multiplexing the VCO signal through non-identical circuitry introduces an undesirable phase step or phase shift in the multiplexer output signal, at the critical time when the PLL changes from velocity lock to phase lock. This phase step must be eliminated before the data may be decoded during phase lock. The time spent performing this phase step elimination task subtracts from the time available for velocity lock and increases the likelihood of invalid data or noisy data. When the VCO base frequency signal must be selected, it is possible to pass the VCO signal through components that approximate the delay of the divide-by-N circuit. This is an attempt to equalize the propagation delay of the data signal between the two data paths, but is only an approximation. Furthermore, multiplexers themselves usually are not perfectly matched along their two paths, especially in complementary metal oxide semiconductor (CMOS) technology. Thus, the phase step experienced when switching between velocity lock and phase lock is still present.

SUMMARY OF THE INVENTION

The present invention eliminates the multiplexer and resultant phase step introduced by the prior art. In this way, more of the synchronization field can be used for velocity lock and the velocity lock mode can be extended as long as possible before the point at which data must be recovered.

As noted above, when switching in the multiplexer from velocity lock to phase lock, the phase of the phase-locked loop will experience a phase step. It is desirable to use velocity lock for as much of the synchronization field as possible, in order to minimize hang-up cycle skipping, and locking to undesirable fractional harmonics. It is also very detrimental to add a phase step just prior to the data field. The solution provided by the present invention is a flip-flop circuit that implements either a divide-by-N or divide-by-1 (no divide) of an input signal, with the result that the signal traverses exactly the same circuit path in either case. The present invention eliminates the multiplexer and the separate divide-by-N circuit. Therefore, the paths must be in a state of being exactly matched and there is no phase step.

In order to accomplish this, a preferred embodiment of the present invention implements a CMOS transfer gate flip-flop, with the inverted output tied to the data input, as in a standard divide-by-2 circuit. The flip-flop of the present invention can function by clocking data to the output, a typical mode for a flip-flop, or the output can follow the input clock. Whichever mode is selected, the operation of the flip-flop will encompass exactly the same circuit path. Therefore, the phase of the velocity lock and phase lock paths will be identical regardless of the data path taken. Furthermore, the present invention may be used for any general path-matching application where the propagation delay in switching between pass-through and D flip-flop operation modes must be identical.

DESCRIPTION OF THE DRAWINGS

The invention will be described with reference to the accompanying drawings wherein:

FIG. 1 is a block diagram of the division circuit of the present invention; and

FIG. 2 is a schematic diagram of the present invention; and

FIG. 3 is a timing diagram illustrating the operation of the circuit of FIG. 2.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by reference to the appended claims.

FIG. 1 is a block diagram of the flip-flop 6 of the present invention. The flip-flop is a CMOS transfer gate flip-flop with $\bar{Q}$ tied to the data input, as in a standard divide-by-2 circuit. In a divide-by-2 operation, the Q output will be equal to one-half of the frequency of a clock signal C applied to the clock input CK. However, the flip-flop may be operated in either a divide-by-1 mode or a divide-by-2 mode, with the propagation delay through a circuit being the same in both modes. Switching between the two modes is implemented by appropriately setting the flip-flop's sets and resets, labeled $\overline{SM}$, $\overline{SS}$, $\overline{RM}$ and $\overline{RS}$ which may be controlled independently.

FIG. 2 shows the circuit configuration of the flip-flop illustrated in FIG. 1. Following the output $\overline{Q}$ to the input line, the signal is passed to a first transfer gate 10, which is supplied with a clock signal C and its inverse $\overline{C}$ (provided from an inverter 8 shown in FIG. 1). In the configuration shown, the first transfer gate 10 will be in an open or data passing condition often being presented with a rising edge on the inverse clock signal $\overline{C}$. The signal from the first transfer gate 10 is then passed to a first NAND gate 12, whose other input is the inverse reset master signal. The output of the NAND gate 12 is passed to a second transfer gate 14 and also to a second NAND gate 16. The second input to the NAND gate 16 is the inverse set master signal. The output of the NAND gate 16 is supplied to a third transfer gate 18. The output of the transfer gate 18 is coupled to the line from the first transfer gate 10 to the input of NAND gate 12. The second transfer gate 14 and the third transfer gate 18 are supplied with the clock and inverse clock signals so that both are open when the clock signal is high, directly opposite to the operation of the first transfer gate 10. The output of the third transfer gate 14 is supplied to the NAND gate 20. The same input line to NAND gate 20 also is coupled to the output of a fourth transfer gate 22. The clock and inverse clock inputs to the transfer gates 14 and 22 are provided such that the transfer gates alternately open and close, so that only one transfer gate at any one time is passing a signal to the NAND gate 20. The other input of the NAND gate 20 is the inverse set slave signal, $\overline{SS}$.

The output of the NAND gate 20 serves as the output signal Q of the flip-flop. The output of the NAND gate 20 is also supplied to a NAND gate 24, which is also supplied with an inverse reset slave signal, $\overline{RS}$. The output of the last NAND gate 24 constitutes the inverse flip-flop output signal $\overline{Q}$ and is also supplied as the input to the fourth transfer gate 22. The inverse output signal is, of course, also tied to the data input of the flip-flop.

As noted above, the circuit of FIG. 1 may be placed in a divide-by-1 mode or a divide-by-2 mode by selectively setting the set and reset signals. In order to place the flip-flop circuit in the divide-by-1 mode, the inverse set master and inverse reset slave signals are set to a low level, while the inverse reset master and inverse set slave signals are set to a high value. In order to select the divide-by-2 mode, all signals are set to high. In the divide-by-1 mode, the output signal simply follows the clock input. This may be seen by comparing FIG. 3(a) with FIG. 3(c). In the divide-by-1 mode, the signals $\overline{SM}$ and $\overline{RS}$ are at low levels. Therefore, the output of the first NAND gate 12 and last NAND gate 24, respectively, are always high. With this in mind, it is easily seen that the first transfer gate 10 and third transfer gate 18 will always be passing a logic high signal. Therefore, for purposes of determining the output Q, one need only examine the transfer gates 14 and 22. The third transfer gate 14 will always have as its input a logic low signal while the last transfer gate 22 will always have as its input a logic high signal. When the clock signal presents a rising edge, the third transfer gate 14 will go open and will pass its logic low signal to NAND gate 20 resulting in a rising edge on the output signal. Conversely, when the clock signal presents a falling edge (a rising edge on the inverse clock signal) to the transfer gate 22, it will pass its logic high signal to NAND gate 20 resulting in an output signal Q of a falling edge. Thus, as shown in FIG. 3(c), the output signal Q follows the input or clock signal.

In the divide-by-2 mode, there are two circuit states that must be examined in determining the Q output signal. These two states correspond to whether the preceding Q value was a logic low or a logic high. FIG. 3(d) shows the case where Q is initially at a logic low and FIG. 3(e) shows the case where the signal Q is initially logic high. Because the flip flop is in the divide-by-2 mode, the frequency of each signal is one-half the frequency of the input signal or clock signal. In each case, a rising edge on the clock signal initiates a transition on the output signal Q. Once again, when analyzing the output signal Q at these transition times, one may simply examine the transfer gates 14 and 22. The first condition to be analyzed will be the condition where Q is a logic low. At the next rising edge on the clock pulse, the Q signal will transition to a logic high. Also after the next rising edge of the clock signal, the transfer gate 14 will be in an open condition. It should be appreciated that transfer gates that close, and also the state of their inputs, also affect the output. In order to transition to a logic high Q signal, the transfer gate 14 must be selecting a logic low signal. Conversely, if the Q signal was previously a logic low, it is obvious that the transfer gate 22 must have passed a logic high signal to the NAND gate 20. This is precisely the circuit environment in the divide-by-1 mode. Therefore, in the rising edge propagation, the divide-by-1 and the divide-by-2 with the case of a preceding logic low Q output signal are identical.

A phased-lock loop (PLL) may be constructed to use only one edge of the VCO output during velocity lock. That edge may be chosen to be the rising edge. Therefore, for this application, (a divide-by-N output), the concern is with the rising edge propagation on a low to high transition on the output signal Q. One needn't be concerned with the second case of a high-to-low transition on the output signal. Because the circuit environment for the divide-by-1 and divide-by-2 for the low-to-high transition are identical, there can be no phase step in changing between one mode and the other. Therefore, the present invention is ideally suited to the PLL application where a phase step is undesirable.

The invention is useful in a much more general sense, as well, in any application where a circuit must be provided wherein there are two functional modes, one using a standard D flip-flop in normal clocked operation, with any operational circuitry connected to its D input, with a specific clock to output rising edge propagation delay, and a second mode wherein the external circuitry forces the D input to a static high level, the flip-flop is set to "pass through" mode, and exactly the same clock to output rising edge propagation delay is achieved.

The invention can be generalized from rising edge to rising edge propagation delay, to a substitution of rising to falling, falling to rising, and falling to falling, simply by placing inverters before the clock input or after the Q output.

The invention is also useful when two separate, simultaneously operating paths must be matched as closely as possible in delay, e.g. a clock signal simultaneously drives a flip-flop in the divide-by-1 mode, and an identical copy of that flip-flop in the divide-by-2 mode, with the resultant pair of clock signals exactly in phase.

What is claimed is:

1. A flip-flop circuit having master and slave set and master and slave reset input gates that may be independently set so as to select between a first state and a second state, the flip-flop circuit also having a clock input signal and an output signal and its complement, wherein:

during the first state the flip-flop circuit operates such that the output signal value follows the clock input signal value; and during the second state the flip-flop circuit operates upon the clock input signal such that the input signal follows the identical circuit path as in the first state upon the occurrence of a low to high logic level transition on the output signal, thereby preventing any phase step when selecting between the first state and the second state.

2. A flip-flop circuit having two modes of operation, a pass-through mode and a data mode, the circuit receiving a clock input signal and generating an output signal, the circuit further including:

means for selecting operation in the pass-through mode; and means for selecting operation in the data mode, wherein:

the input signal during each mode follows an identical circuit path and results in an output signal having an identical propagation delay for each mode.

3. A flip-flop circuit having:

first, second, third, and fourth NAND gates, one input of the first NAND gate comprising an inverse reset master signal of the flip-flop, one input of the second NAND gate comprising an inverse set master signal of the flip-flop and the other input comprising a first NAND gate output signal, one input of the third NAND gate comprising an inverse set slave signal of the flip-flop, one input of the fourth NAND gate comprising an inverse reset slave signal of the flip-flop and the other input comprising an output signal of the third NAND gate;

first and second transfer gates connected such that the gates alternately open and close with respect to each other in accordance with a clock signal, the output signal of the first and second transfer gates being supplied to the first NAND gate, the input of the first transfer gate comprising the output signal of the fourth NAND gate and the input of the second transfer gate comprising the output signal of the second NAND gate; and third and fourth transfer gates connected such that the gates alternately open and close with respect to each other in accordance with a clock signal and such that the second and third transfer gates together open and close alternately with the first and fourth transfer gates, which also open and close together, the output signal of the third and fourth transfer gates being supplied to the third NAND gate, the input of the third transfer gate comprising the output signal of the first NAND gate and the input signal of the fourth transfer gate comprising the output signal of the fourth NAND gate.

4. A CMOS transfer gate flip-flop circuit having master and slave set and reset input gates that may be independently set so as to select between a first operating state and a second operating state, the circuit also having a clock input signal and an output signal, wherein:

during the first state the flip-flop circuit operates in a divide-by-one mode such that the output signal follows the clock input signal;

during the second state the flip-flop circuit operates in a divide-by-two mode such that the output signal has a frequency half that of the clock input signal; and the clock input signal follows a circuit path in the flip-flop circuit that is the same for the first state and the second state, thereby eliminating any phase step when selecting between the first state and the second state.

* * * * *